United States Patent
Lee et al.

(10) Patent No.: US 11,127,847 B2
(45) Date of Patent: Sep. 21, 2021

(54) SEMICONDUCTOR DEVICES HAVING A GATE FIELD PLATE INCLUDING AN EXTENSION PORTION AND METHODS FOR FABRICATING THE SEMICONDUCTOR DEVICE

(71) Applicant: Vanguard International Semiconductor Corporation, Hsinchu (TW)

(72) Inventors: Chia-Hao Lee, New Taipei (TW); Chang-Xiang Hung, Budai Township (TW); Manoj Kumar, Dhanbad (IN); Chih-Cherng Liao, Zhudong Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/413,893

(22) Filed: May 16, 2019

(65) Prior Publication Data
US 2020/0365718 A1   Nov. 19, 2020

(51) Int. Cl.
*H01L 29/778* (2006.01)
*H01L 29/20* (2006.01)
(Continued)

(52) U.S. Cl.
CPC ...... *H01L 29/7786* (2013.01); *H01L 21/0254* (2013.01); *H01L 21/0337* (2013.01);
(Continued)

(58) Field of Classification Search
CPC ............... H01L 29/7786; H01L 29/205; H01L 29/66462; H01L 29/2003; H01L 29/778; H01L 29/407; H01L 21/0254; H01L 21/0337; H01L 2924/1033; H01L 2924/10344; H01L 29/404; H01L 29/402; H01L 29/405; H01L 29/66492
See application file for complete search history.

(56) References Cited

U.S. PATENT DOCUMENTS

| 7,388,236 B2* | 6/2008 | Wu ...................... H01L 29/7787 257/192 |
| 7,763,910 B2* | 7/2010 | Marui .................. H01L 29/402 257/192 |

(Continued)

FOREIGN PATENT DOCUMENTS

| TW | 201511261 A | 3/2015 |
| TW | 201633538 A | 9/2016 |
| TW | 201703260 A | 1/2017 |

*Primary Examiner* — Khiem D Nguyen
(74) *Attorney, Agent, or Firm* — Birch, Stewart, Kolasch & Birch LLP

(57) ABSTRACT

A semiconductor device includes a compound semiconductor layer disposed over a substrate, a protection layer disposed over the compound semiconductor layer, and a source electrode, a drain electrode and a gate electrode which penetrate through the protection layer and are disposed on the compound semiconductor layer. The semiconductor device also includes a gate field plate connecting the gate electrode and disposed over a portion of the protection layer between the gate electrode and the drain electrode. The gate field plate has an extension portion extending into the protection layer.

19 Claims, 8 Drawing Sheets

(51) Int. Cl.
*H01L 29/205* (2006.01)
*H01L 21/02* (2006.01)
*H01L 29/66* (2006.01)
*H01L 21/033* (2006.01)
*H01L 29/40* (2006.01)

(52) U.S. Cl.
CPC ........ H01L 29/2003 (2013.01); H01L 29/205 (2013.01); H01L 29/407 (2013.01); H01L 29/66462 (2013.01)

(56) References Cited

U.S. PATENT DOCUMENTS

| | | | | |
|---|---|---|---|---|
| 9,093,512 | B2* | 7/2015 | Ohki | H01L 29/408 |
| 9,202,880 | B1* | 12/2015 | Corrion | H01L 29/402 |
| 9,312,343 | B2* | 4/2016 | Zhang | H01L 29/0623 |
| 9,368,359 | B2* | 6/2016 | Makiyama | H01L 29/66462 |
| 9,502,548 | B1* | 11/2016 | Liao | H01L 29/7786 |
| 9,929,243 | B1* | 3/2018 | Corrion | H01L 29/78 |
| 2009/0146186 | A1* | 6/2009 | Kub | H01L 29/66462 257/194 |
| 2009/0230429 | A1* | 9/2009 | Miyamoto | H01L 29/7787 257/192 |
| 2010/0163936 | A1* | 7/2010 | Immorlica | H01L 29/66462 257/284 |
| 2012/0217544 | A1* | 8/2012 | Ohki | H01L 29/7787 257/194 |
| 2012/0235160 | A1* | 9/2012 | Heikman | H01L 29/66462 257/76 |
| 2013/0087804 | A1* | 4/2013 | Yao | H01L 29/7787 257/76 |
| 2013/0105817 | A1* | 5/2013 | Saunier | H01L 29/7787 257/77 |
| 2014/0097471 | A1* | 4/2014 | Briere | H01L 29/7786 257/194 |
| 2014/0124789 | A1* | 5/2014 | Ramdani | H01L 29/66462 257/76 |
| 2014/0361342 | A1* | 12/2014 | Sriram | H01L 29/402 257/194 |
| 2015/0179782 | A1 | 6/2015 | Yamamura | |
| 2015/0255547 | A1* | 9/2015 | Yuan | H01L 27/0629 257/76 |
| 2016/0268408 | A1* | 9/2016 | Oasa | H01L 29/42316 |
| 2016/0359035 | A1* | 12/2016 | Yu | H01L 29/2003 |
| 2019/0341480 | A1* | 11/2019 | Boles | H01L 29/404 |

* cited by examiner

SEMICONDUCTOR DEVICES HAVING A GATE FIELD PLATE INCLUDING AN EXTENSION PORTION AND METHODS FOR FABRICATING THE SEMICONDUCTOR DEVICE

BACKGROUND

Technical Field

The disclosure relates to semiconductor devices, and more particularly, to semiconductor devices having field plates and methods for fabricating the same.

Description of the Related Art

Gallium nitride-based (GaN-based) semiconductor materials have many excellent characteristics, such as high thermal resistance, wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMT) with heterogeneous interfacial structures.

A field plate is typically disposed in the high electric field region of a semiconductor device in order to reduce the peak electric field of the high electric field region. One type of field plate is a field plate that is connected to the gate electrode (i.e., gate field plate), which can reduce the electric field intensity at the side of the gate near the drain. Thus, the gate field plate can improve the breakdown voltage of the semiconductor device to allow the semiconductor device to be used in high-voltage operating environments.

With the developments in GaN-based semiconductor materials, these semiconductor devices that use GaN-based semiconductor materials are being applied in more critical working environments, such as those with higher frequencies or higher temperatures. Therefore, the processes of fabricating semiconductor devices with GaN-based semiconductor materials face various new challenges.

SUMMARY

Some embodiments of the present disclosure provide a semiconductor device. The semiconductor device includes a compound semiconductor layer disposed over a substrate, a protection layer disposed over the compound semiconductor layer, and a source electrode, a drain electrode and a gate electrode which penetrate through the protection layer and are disposed on the compound semiconductor layer. The semiconductor device also includes a gate field plate connecting the gate electrode and disposed over a portion of the protection layer between the gate electrode and the drain electrode, wherein the gate field plate has an extension portion extending into the protection layer.

Some embodiments of the present disclosure provide a method for fabricating a semiconductor device. The method includes forming a compound semiconductor layer over a substrate, forming a protection layer over the compound semiconductor layer, forming a source electrode, a drain electrode, and a gate electrode through the protection layer and over the compound semiconductor layer, and forming a gate field plate over a portion of the protection layer between the gate electrode and the drain electrode to connect the gate electrode, wherein the gate field plate has an extension portion extending into the protection layer.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

Figure 1A:
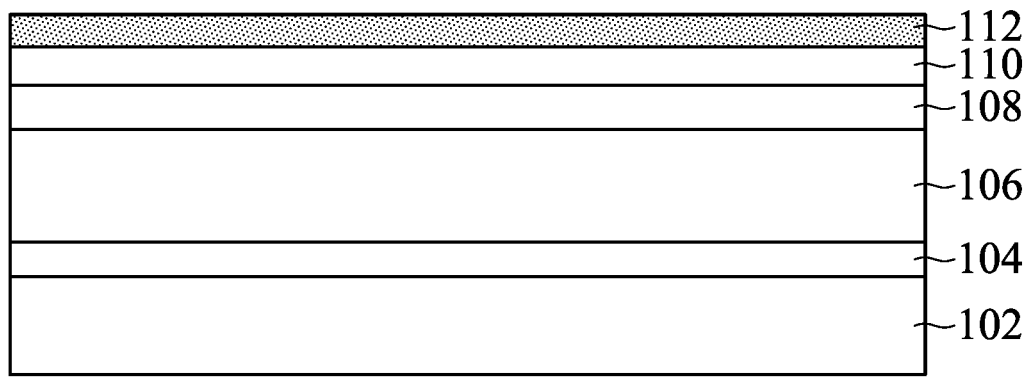
FIGS. 1A-1H illustrate cross-sectional views of forming a semiconductor device at intermediate stages in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

The embodiments of the present disclosure provide semiconductor devices, particularly suitable for high electron mobility transistors (HEMT), and methods for fabricating the same. The material of the gate electrode that is proximate to the drain side may be punched through by the high electric field strength between the gate electrode and the drain electrode. The embodiments of the present disclosure form a gate field plate with an extension portion that extends into a protection layer to mitigate the electric field gradient at the side of the gate electrode that is proximate to the drain electrode to enhance the breakdown voltage of a semiconductor device, which in turn enhances the performance of the semiconductor device.

Figure 1B:
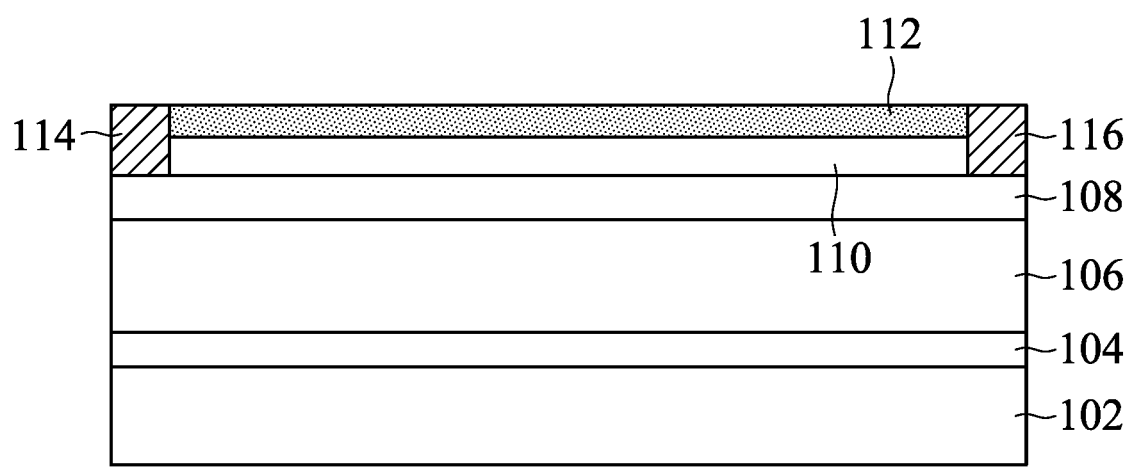
Figure 1C:
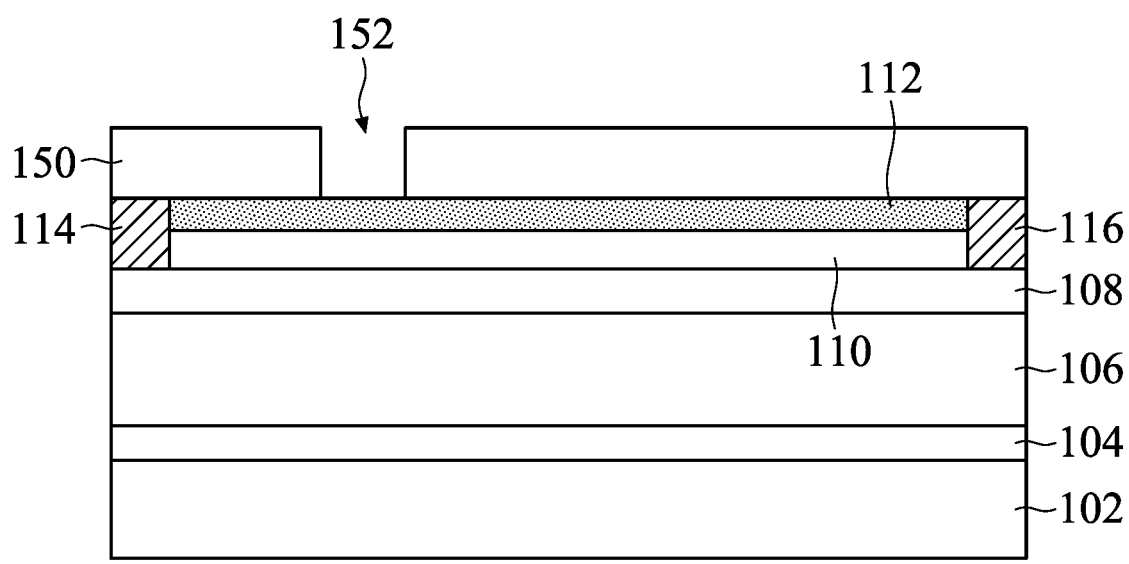
Figure 1D:
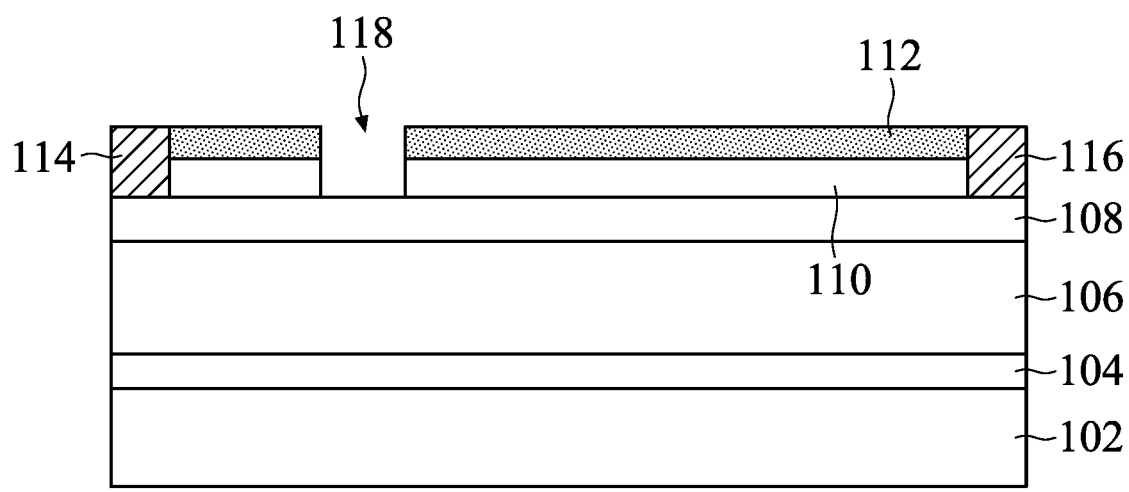
Figure 1E:
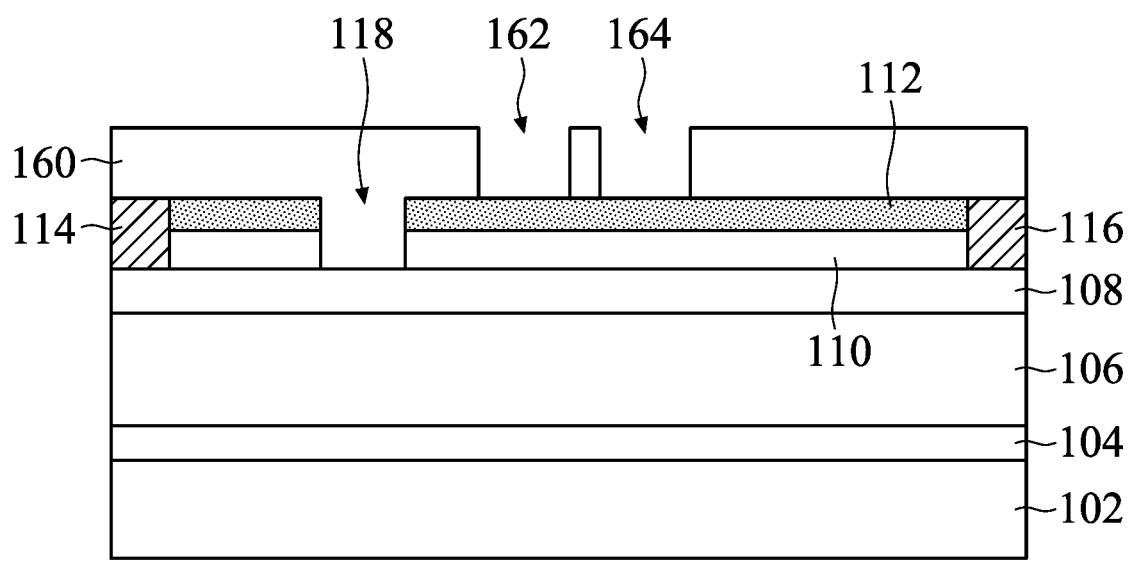
Figure 1F:
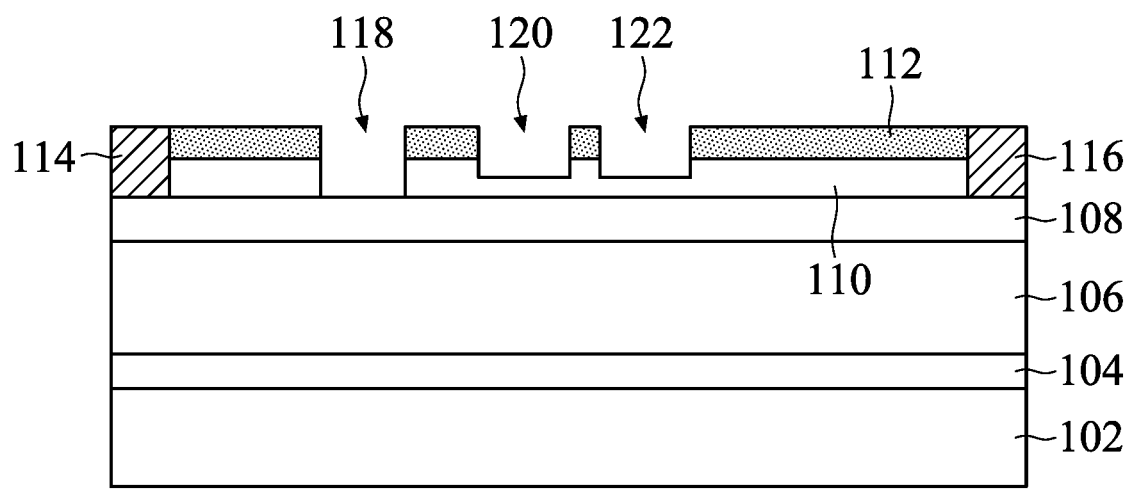
Figure 1G:
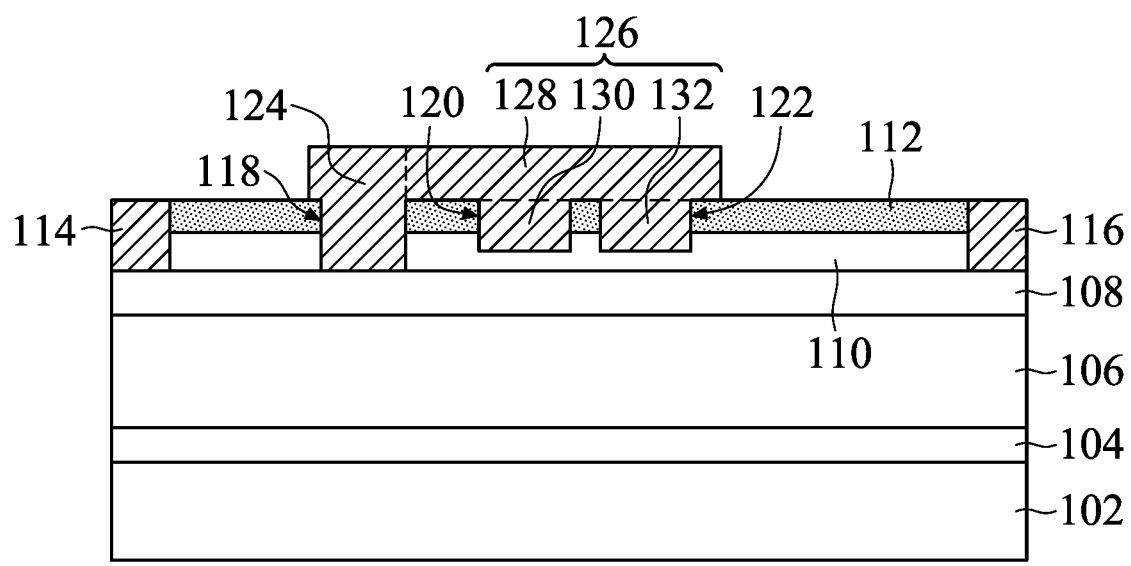
Figure 1H:
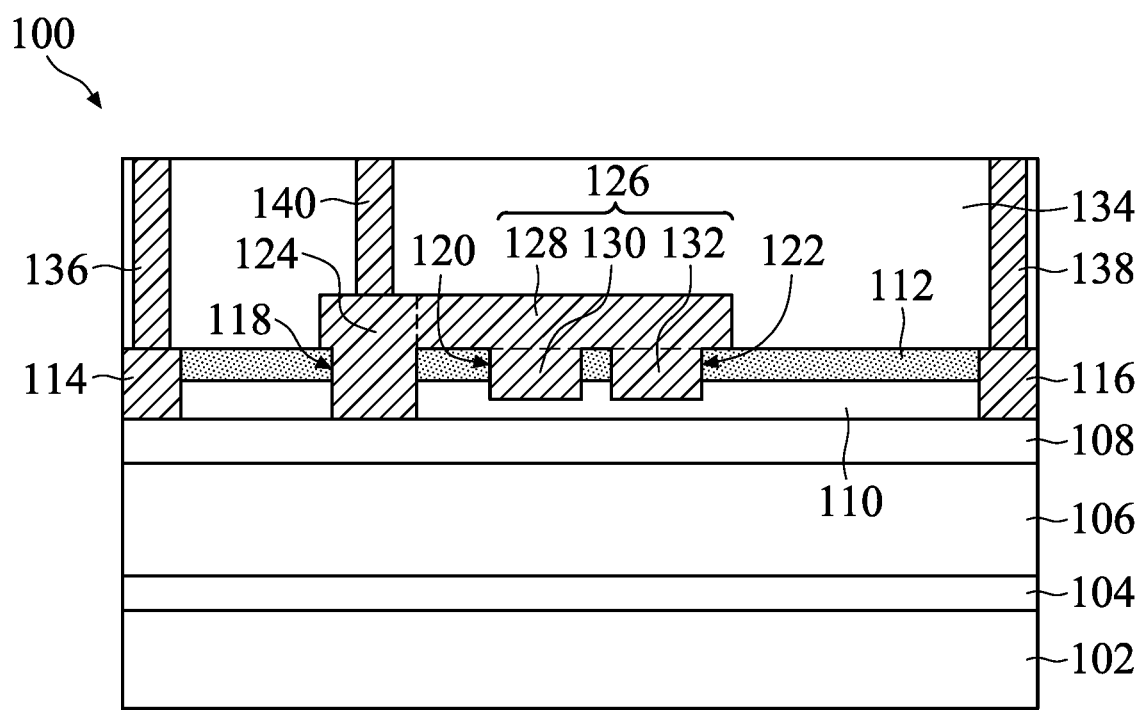

FIGS. 1A-1H illustrate cross-sectional views of forming a semiconductor device 100 shown in FIG. 1H at intermediate stages in accordance with some embodiments of the present disclosure. Referring to FIG. 1A, a substrate 102 is provided. Next, a buffer layer 104 is formed over the substrate 102, a gallium nitride (GaN) semiconductor layer 106 is formed over the buffer layer 104, and an aluminum gallium nitride ($Al_xGa_{1-x}N$, wherein $0<x<1$) semiconductor layer 108 formed over the GaN semiconductor layer 106. In some embodiments, a seed layer (not shown) may be formed between the substrate 102 and the buffer layer 104.

In some embodiments, the substrate 102 may be a doped (such as doped with a p-type or an n-type dopant) or an undoped semiconductor substrate, such as a silicon substrate, a silicon germanium substrate, a gallium arsenide substrate, or the like. In some embodiments, the substrate 102 may be a semiconductor-on-insulator substrate, such as a silicon-on-insulator (SOI) substrate. In some embodiments, the substrate 102 may be a glass substrate or a ceramic substrate, such as a silicon carbide (SiC) substrate, an aluminum nitride (AlN) substrate, or a sapphire substrate.

In some embodiments, the material of the seed layer may be formed of aluminum nitride (AlN), aluminum oxide ($Al_2O_3$), aluminum gallium nitride (AlGaN), silicon carbide (SiC), aluminum (Al), or a combination thereof. The seed layer may be a single-layer or a multilayered structure. The seed layer may be formed by an epitaxial growth process, such as metal organic chemical vapor deposition (MOCVD), hydride vapor phase epitaxy (HVPE), molecular beam epitaxy (MBE), or a combination thereof.

The buffer layer 104 may be helpful in mitigating a strain of the GaN semiconductor layer 106 which is subsequently formed over the buffer layer 104, and to prevent defects from forming in the overlying GaN semiconductor layer 106. The strain is caused by a mismatch between the GaN semiconductor layer 106 and the substrate 102. In some embodiments, the material of the buffer layer 104 may be AlN, GaN, $Al_xGa_{1-x}N$ (wherein 0<x<1), a combination thereof, or the like. The buffer layer 104 may be formed by using an epitaxial growth process, such as MOCVD, HVPE, MBE, a combination thereof or the like. Although in the embodiment as shown in FIG. 1A the buffer layer 104 is a single layer, the buffer layer 104 may also be a multilayered structure. In addition, the material of the buffer layer 104 is decided by the material of the seed layer and the gas introduced during the epitaxial process.

Two-dimensional electron gas (2DEG, not shown) is formed at a heterogeneous interface between the GaN semiconductor layer 106 and the AlGaN semiconductor layer 108. The semiconductor device 100 as shown in FIG. 1H is a high electron mobility transistor (HEMT) which utilizes 2DEG as conductive carriers. In some embodiments, the GaN semiconductor layer 106 and the AlGaN semiconductor layer 108 may have no dopant therein. In some other embodiments, the GaN semiconductor layer 106 and the AlGaN semiconductor layer 108 may be doped, such as with an n-type or a p-type dopant. In some embodiments of the present disclosure, the GaN semiconductor layer 106 and the AlGaN semiconductor layer 108 may be formed by using epitaxial growth processes, such as MOCVD, HVPE, MBE, a combination thereof or the like.

Still referring to FIG. 1A, a first protection layer 110 is formed over the AlGaN semiconductor layer 108. A second protection layer 112 is formed over the first protection layer 110. In some embodiments, the materials of the first protection layer 110 and the second protection layer 112 may be insulation materials or dielectric materials, such as silicon oxide ($SiO_2$), silicon nitride (SiN), silicon oxynitride (SiON), aluminum oxide ($Al_2O_3$), aluminum nitride (AlN), magnesium oxide (MgO), magnesium nitride ($Mg_3N_2$), zinc oxide (ZnO), titanium oxide ($TiO_2$), or a combination thereof. The first protection layer 110 and the second protection layer 112 are used to prevent leak current that is generated in the underlying AlGaN semiconductor layer 108 from flowing to the source electrode 114, the drain electrode 116, and the gate electrode 124 formed subsequently (shown in FIG. 1G). The first protection layer 110 and the second protection layer 112 may be formed by using chemical vapor deposition (CVD), plasma enhanced CVD (PECVD), atomic layer deposition (ALD) or the like.

In some embodiments, the material of the second protection layer 112 is different from the material of the first protection layer 110. For example, the underlying first protection layer 110 may be selected from a high-quality oxide film, such as silicon oxide film, formed by a thermal growth. The overlying second protection layer 112 may be selected form dielectric materials having higher etching selectivity than the first protection layer 110.

Although in the embodiments shown in FIG. 1A two protection layers 110 and 112 are formed over the AlGaN semiconductor layer 108, one or more than two protection layers may be formed over the AlGaN semiconductor layer 108 in some other embodiments.

Referring to FIG. 1B, a source electrode 114 and a drain electrode 116 are formed over the AlGaN semiconductor layer 108. The source electrode 114 and the drain electrode 116 penetrate through the second protection layer 112 and the first protection layer 110 to contact the AlGaN semiconductor layer 108. In some embodiments, the materials of the source electrode 114 and the drain electrode 116 may be conductive materials, such as metal materials or semiconductor materials. The metal material may be gold (Au), nickel (Ni), platinum (Pt), palladium (Pd), iridium (Ir), titanium (Ti), chromium (Cr), tungsten (W), aluminum (Al), copper (Cu), the like, a combination thereof, or multilayers thereof. The semiconductor material may be a doped polysilicon, poly-germanium, or the like. The steps of forming the source electrode 114 and the drain electrode 116 may include forming openings (not shown) for the source electrode 114 and the drain electrode 116 through the second protection layer 112 and the first protection layer 110 to expose the upper surface of the AlGaN semiconductor layer 108 by using an etching process, depositing a conductive material layer (not shown) over the second protection layer 112 to fill the openings, and performing a patterning process on the conductive material layer to form the source electrode 114 and the drain electrode 116. The deposition process of forming the source electrode 114 and the drain electrode 116 may be ALD, CVD, physical vapor deposition (PVD), sputtering or the like.

Referring to FIG. 1C, a first patterned mask layer 150 is formed over the second protection layer 112. The first patterned mask layer 150 has a first opening 152 which exposes a region of the upper surface of the second protection layer 112 where the gate electrode 124 (shown in FIG. 1G) is predetermined to be formed. In some embodiments, the first patterned mask layer 150 may be a patterned photoresist layer or a patterned hard mask layer.

Next, an etching process is performed on the second protection layer 112 and the first protection layer 110 through the first opening 152 of the first patterned mask layer 150. As shown in FIG. 1D, after the etching process, a first recess 118 is formed in the second protection layer 112 and the first protection layer 110. The first recess 118 penetrates through the second protection layer 112 and the first protection layer 110 to expose the upper surface of the AlGaN semiconductor layer 108. In some embodiments, the etching process may be a dry etching process, a wet etching process, or a combination thereof. The dry etching process may be reactive ion etch (RIE), electron cyclotron resonance (ERC) etching, inductively-coupled plasma (ICP) etch, or the like. The etching process may select a suitable etchant for the materials of the second protection layer 112 and the first protection layer 110. For example, in an embodiment in which the second protection layer 112 is silicon nitride and the first protection layer 110 is silicon oxide, a portion of the second protection layer 112 exposed from the first opening 152 may be removed by using hot phosphoric acid, and then a portion of the first protection layer 110 exposed from the first opening 152 may be removed by using dilute hydrofluoric (dHf).

Next, the first patterned mask layer 150 over the second protection layer 112 is removed. In some embodiment, the first patterned mask layer 150 is removed by using an ashing process or a wet strip process.

Referring to FIG. 1E, a second patterned mask layer 160 is formed over the second protection layer 112. The second patterned mask layer 160 has a second opening 162 and a third opening 164 which expose some regions of the upper surface of the second protection layer 112 where extension portions 130 and 132 of the gate field plate 126 (shown in FIG. 1G) are predetermined to be formed. In some embodiments, the second patterned mask layer 160 may be a patterned photoresist layer or a patterned hard mask layer.

Next, an etching process is performed on the second protection layer 112 and the first protection layer 110 through the second opening 162 and the third opening 164 of the second patterned mask layer 160. As shown in FIG. 1F, after the etching process, a second recess 120 and the third recess 122 are formed in the second protection layer 112 and the first protection layer 110. The second recess 120 and the third recess 122 penetrate through the second protection layer 112 and extend into the first protection layer 110. The second recess 120 and the third recess 122 do not entirely penetrate through the first protection layer 110, and portions of the first protection layer 110 directly under the second recess 120 and the third recess 122 remain on the AlGaN semiconductor layer 108. In some embodiments, the etching process may include a main-etching step for the second protection layer 112 to form the second recess 120 and the third recess 122 in the second protection layer 112, and may include an over-etching step to extend the second recess 120 and the third recess 122 into the first protection layer 110. For example, after the main-etching step for the second protection layer 112 is finished, the first protection layer 110 may be continued to be over-etched for a duration, such as from about 10% to about 30% of the time of the main-etched step, without removing the substrate 102 from the etching equipment. In some embodiment, the etching process for the second recess 120 and the third recess 122 may be a dry etching process, a wet etching process, or a combination thereof, and may be same as, similar to, or different from the etching for the first recess 118 described above.

Referring to FIG. 1G, a gate electrode 124 and a gate field plate 126 connecting therewith are formed over the second protection layer 112. The gate electrode 124 is filled into the first recess 118 and contact the AlGaN semiconductor layer 108. The gate field plate 126 has a connection portion 128 connecting the gate electrode 124, and a first extension portion 130 and a second extension portion 132 respectively filled into the second recess 120 and the third recess 122. The connection portion 128 is located over a region of the upper surface of the second protection layer 112 between the gate electrode 124 and the drain electrode 116.

In some embodiments, the steps of forming the gate electrode 124 and the gate field plate 126 may include depositing a conductive material layer (not shown) over the second protection layer 112 to fill the first recess 118, the second recess 120, and the third recess 122, and patterning the conductive material layer. The patterning process for the conductive material layer may include forming a patterned mask layer (not shown) over the conductive material layer by using a photolithography process, performing an etching process, such as a dry etching or a wet etching, on the conductive material layer to remove portions of the conductive material layer uncovered by the patterned mask layer, and then removing the patterned mask layer over a remaining portion of the conductive material layer. In some embodiments, the conductive material layer may be a metal material or a semiconductor material. The metal material may be gold (Au), nickel (Ni), platinum (Pt), palladium (Pd), iridium (Ir), titanium (Ti), chromium (Cr), tungsten (W), aluminum (Al), copper (Cu), the like, a combination thereof, or multilayers thereof. The semiconductor material may be a doped polysilicon, poly-germanium, or the like. The conductive material layer may be formed by using ALD, CVD, PVD, sputtering, or the like.

Referring to FIG. 1H, an inter-layer dielectric layer (ILD) 134 is formed over the second protection layer 112. The ILD layer 134 covers the gate electrode 124, the gate field plate 126, the source electrode 114, and the drain electrode 116. Next, a source contact 136 connecting the source electrode 114, a drain contact 138 connecting the drain electrode 116, and a gate contact 140 connecting the gate electrode 124 are formed in the ILD layer 134. After an interconnect structure including the ILD 134, the source contact 136, the drain contact 138, and the gate contact 140 is formed, a semiconductor device 100 is produced.

In some embodiments, the material of the ILD layer 134 may be silicon oxide, silicon nitride, silicon oxynitride, or aluminum oxide. The ILD layer 134 may be formed by using CVD, PECVD, ALD or the like.

In some embodiments, the material of the source contact 136, the drain contact 138, and the gate contact 140 may be a metal material, such as gold (Au), nickel (Ni), platinum (Pt), palladium (Pd), iridium (Ir), titanium (Ti), chromium (Cr), tungsten (W), aluminum (Al), copper (Cu), the like, a combination thereof, or multilayers thereof. The steps of forming the source contact 136, the drain contact 138, and the gate contact 140 may include forming openings (not shown) which correspond to the source electrode 114, the drain electrode 116, and the gate electrode 124 and penetrate through the ILD layer 134 to respectively expose the source electrode 114, the drain electrode 116, and the gate electrode 124 by using a patterning process, depositing a metal material (not shown) over the ILD layer 134 to fill the openings, and then performing a planarization process, such as chemical mechanical polish (CMP), to remove portions of the metal material over the ILD layer 134.

In the embodiments shown in FIG. 1H, the semiconductor device 100 includes the substrate 102, and the buffer layer 104, the GaN semiconductor layer 106 and the AlGaN semiconductor layer 108 sequentially stacked over the substrate 102. The semiconductor device 100 also includes the first protection layer 110 disposed over the AlGaN semiconductor layer 108, the second protection layer 112 disposed over the first protection layer 110, and the source electrode 114, the drain electrode 116, and the gate electrode 124 which penetrate through the second protection layer 112 and the first protection layer 110 and contact the AlGaN semiconductor layer 108.

The semiconductor device 100 also includes the gate field plate 126 connecting the gate electrode 124. The gate field plate 126 has a connection portion 128 connecting the gate electrode 124, and the first extension portion 130 and the second extension portion 132 extending into the second protection layer 112 and the first protection layer 110. The connection portion 128 is located over the second protection layer 112 and extends from the gate electrode 124 toward the drain electrode 116. The first extension portion 130 and the second extension portion 132 are located between the gate electrode 124 and the drain electrode 116. The first extension portion 130 and the second extension portion 132 are separated from the upper surface of the AlGaN semiconductor layer 108 by the first protection layer 110.

Generally, when voltages are applied to the gate electrode and the drain electrode, the material of the gate electrode proximate to the drain side, particularly at the corners of the gate electrode, may be punched through due to the high electric field strength between the gate electrode and the drain electrode. It should be noted that in the embodiments of the present disclosure, the gate field plate 126 disposed between the gate electrode 124 and the drain electrode 116 can mitigate the electric field gradient at the side of the gate electrode 124 that is proximate to the drain electrode 116. Furthermore, since the gate field plate 126 has a first extension portion 130 and a second extension portion 132 that extend into the second protection layer 112 and the first protection layer 110, the electric field distribution under the connection portion 128 will be concentrated in the extension portions 130 and 132, which further mitigates the electric field gradient at the side of the gate electrode 124 that is proximate to the drain electrode 116. Thus, the embodiments of the present disclosure utilize a gate field plate with an extension portion that extends into the protection layer to enhance the breakdown voltage of the semiconductor device 100, which in turn enhances the performance of the semiconductor device 100.

Although in the embodiments shown in FIG. 1H the gate field plate 126 has two extension portions 130 and 132 between the gate electrode 124 and the drain electrode 116, in some other embodiments the gate field plate 126 may have one or more than two extension portions between the gate electrode 124 and the drain electrode 116 to mitigate the electric field gradient at the side of the gate electrode 124 that is proximate to the drain electrode 116. Furthermore, the width of the first extension portion 130, the width of the second extension portion 132, and the distance between the first extension portion 130 and the second extension portion 132 may be based on design demands and are not limited to the embodiments illustrated in FIG. 1H.

In addition, since the extension portions 130 and 132 of the gate field plate 126 penetrate through the second protection layer 112 and extend into the first protection layer 110, the extension portions 130 and 132 are close to the AlGaN semiconductor layer 108, which helps to transfer heat generated during operating the semiconductor device 100, and thus the performance of the semiconductor device 100 can be further enhanced.

Figure 2A:
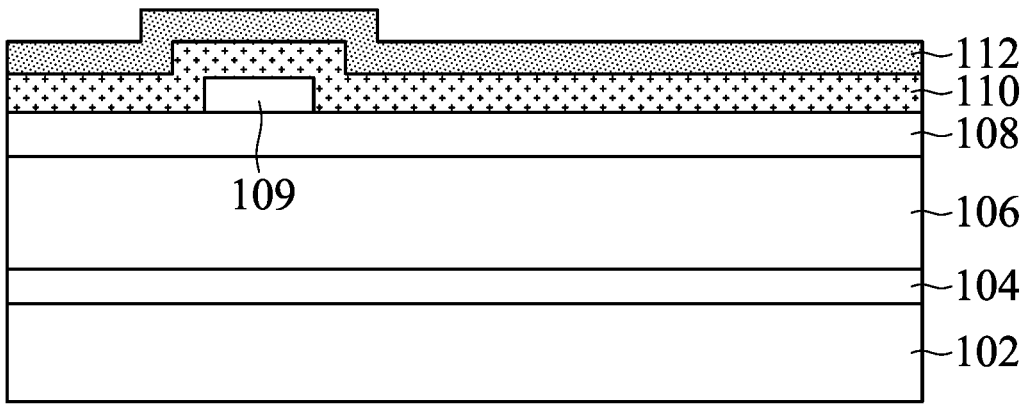
FIGS. 2A-2H illustrate cross-sectional views of forming a semiconductor device at intermediate stages in accordance with some other embodiments of the present disclosure.
Figure 2B:
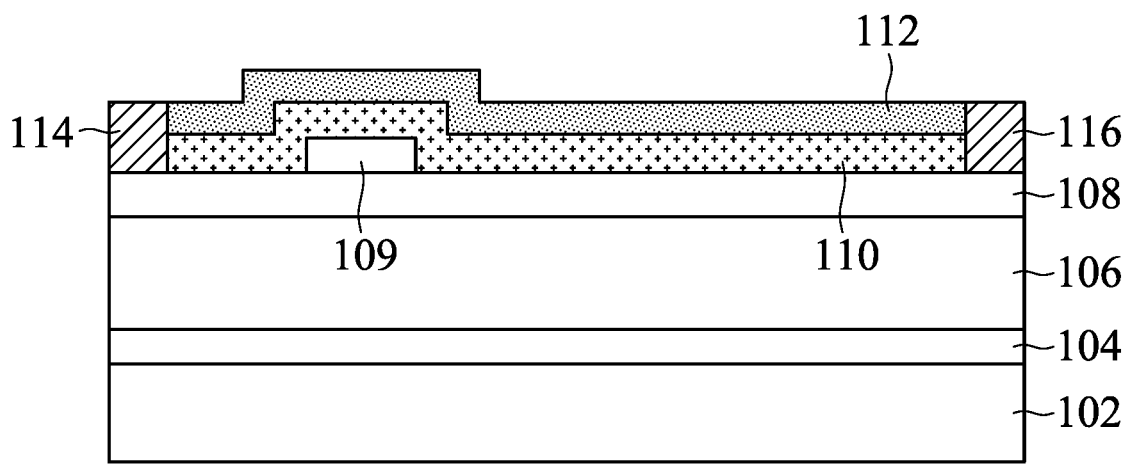
Figure 2C:
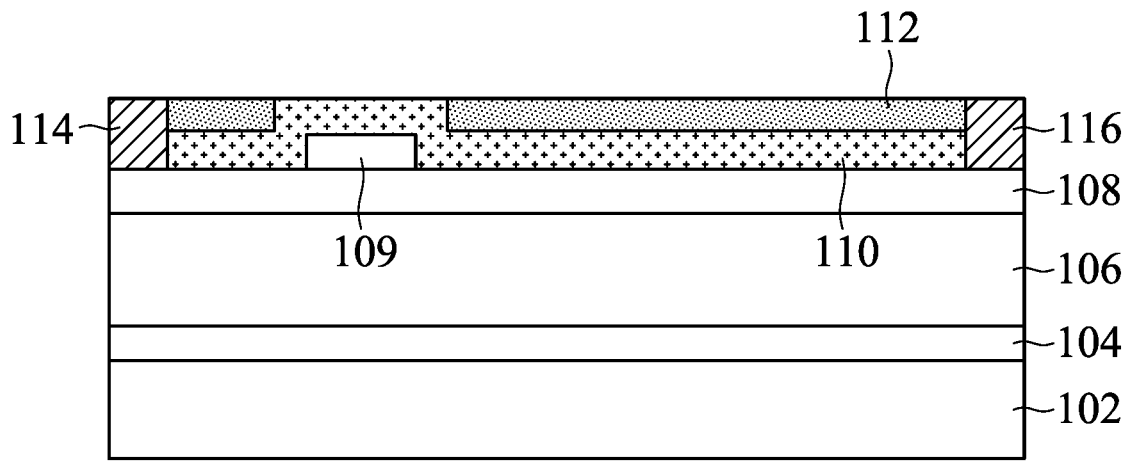
Figure 2D:
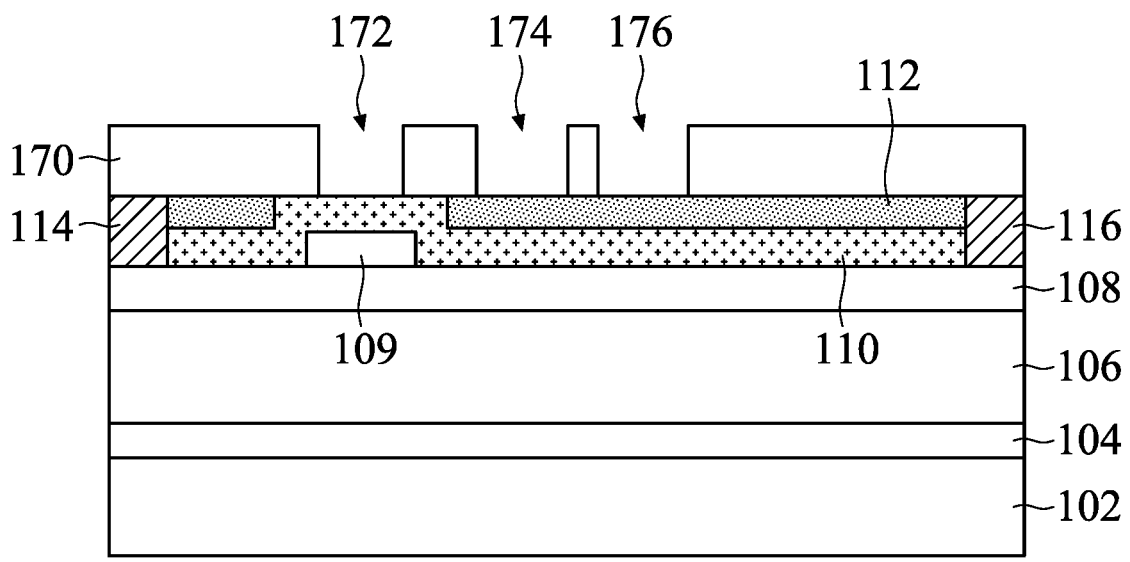
Figure 2E:
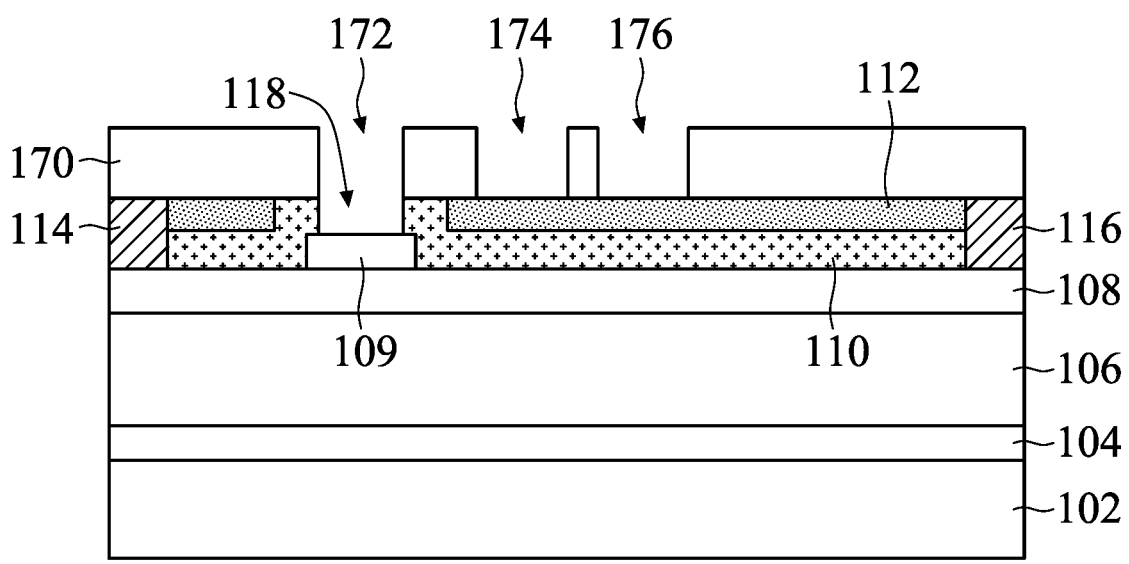
Figure 2F:
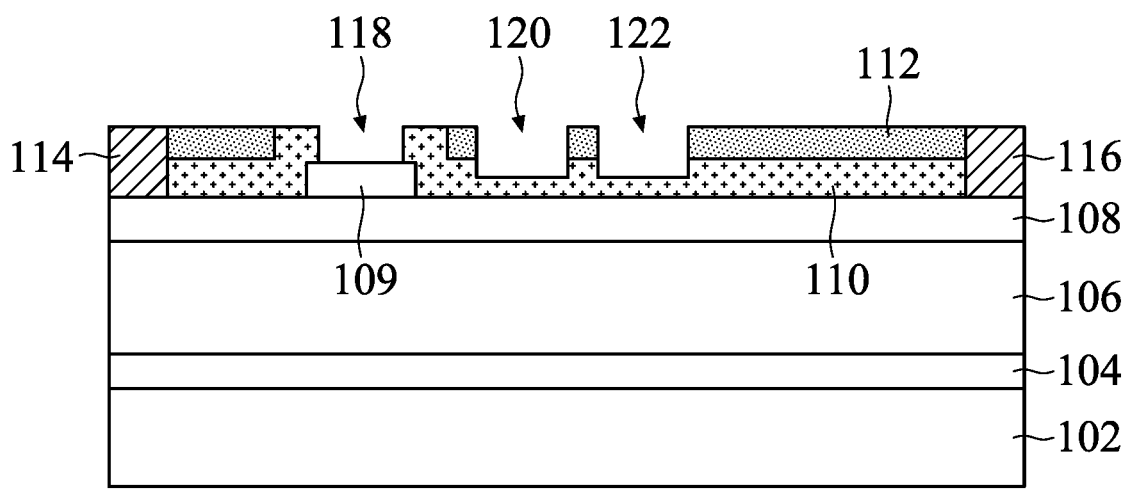
Figure 2G:
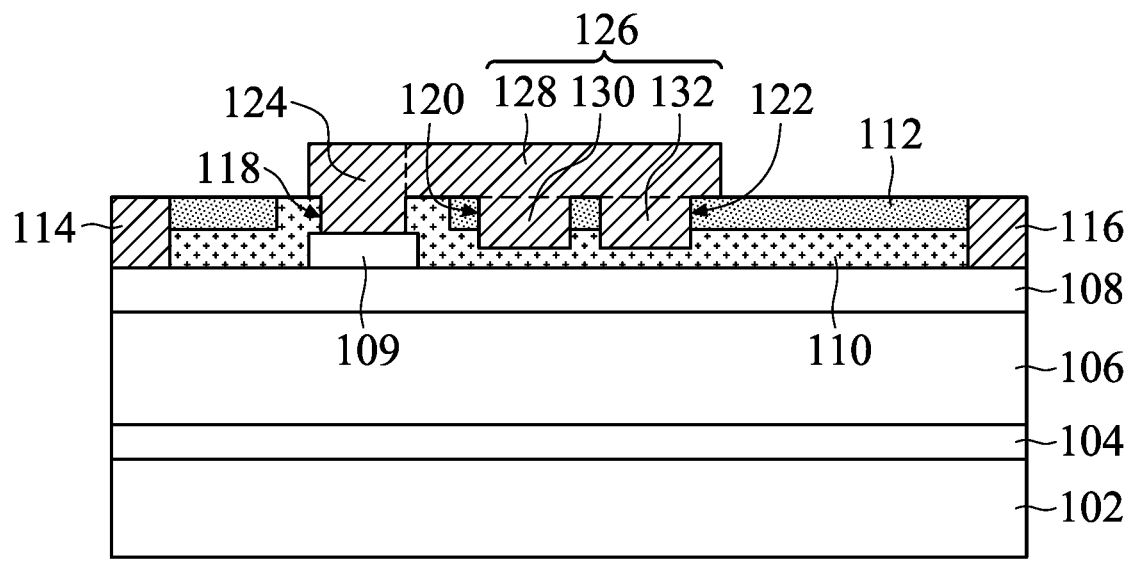
Figure 2H:
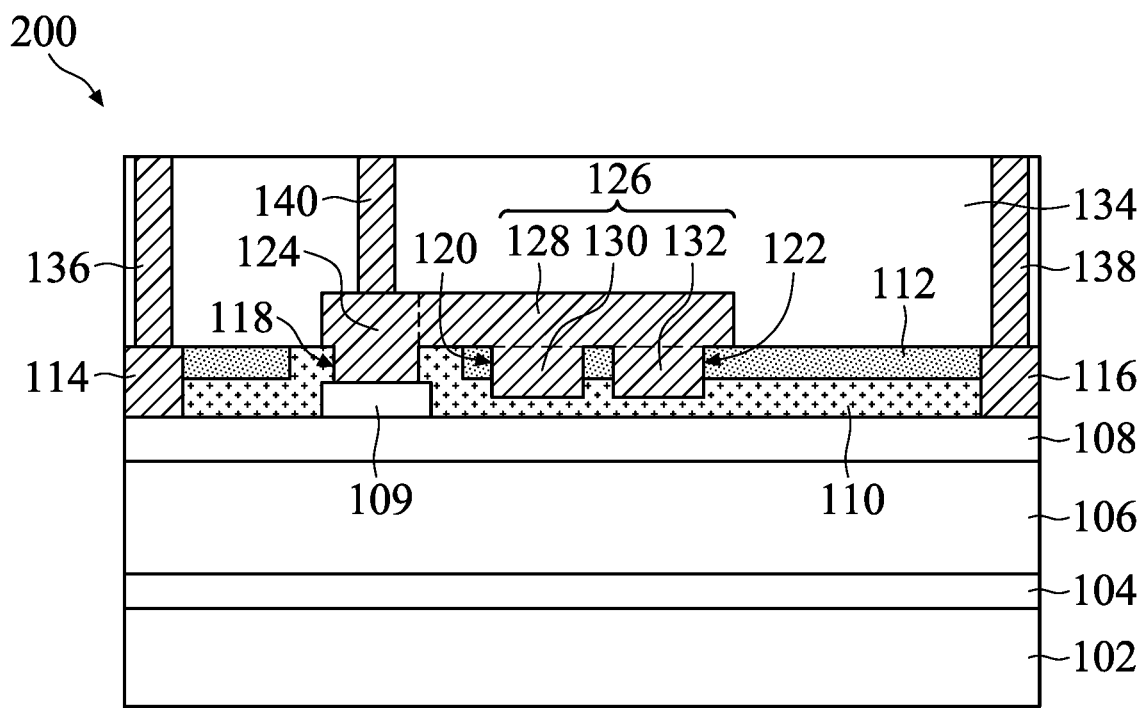

FIGS. 2A-2H illustrate cross-sectional views of forming a semiconductor device 200 shown in FIG. 2H at intermediate stages in accordance with some other embodiments of the present disclosure. Elements or layers in FIGS. 2A-2H that are the same or similar to those in FIGS. 1A-1H are denoted by like reference numerals that have the same meaning, and the description thereof will not be repeated for the sake of brevity. The difference between the embodiments shown in FIGS. 2A-2H and FIGS. 1A-1H is that the semiconductor device 200 shown in FIG. 2H further includes a doped compound semiconductor block 109 between the AlGaN semiconductor layer 108 and the gate electrode 124.

Referring to FIG. 2A, a semiconductor substrate 102 is provided. A buffer layer 104, a GaN semiconductor layer 106, and an AlGaN semiconductor layer 108 are then sequentially formed over the semiconductor layer 102. A doped compound semiconductor block 109 is then formed over the AlGaN semiconductor layer 108. In some embodiments, the doped compound semiconductor block 109 may be the rectangular shape as shown in FIG. 2A or may be other shapes, such as the trapezoidal shape. In addition, the upper surface of the doped compound semiconductor block 109 may not be flat.

In following processes, a gate electrode 124 (shown in FIG. 2G) is to be formed over the doped compound semiconductor block 109. The generation of 2DEG under the gate electrode 124 can be inhibited by disposing the doped compound semiconductor block 109 between the gate electrode 124 and the AlGaN semiconductor layer 108 so as to attain a normally-off status for the semiconductor device 200. In some embodiments, the material of the doped compound semiconductor block 109 may be GaN which is doped with a p-type dopant or an n-type dopant. The steps of forming the doped compound semiconductor block 109 may include depositing a doped compound semiconductor layer (not shown) over the AlGaN semiconductor layer 108 by using an epitaxial growth process, and performing a patterning process on the doped compound semiconductor layer to form the doped compound semiconductor block 109 corresponding to the predetermined position where the gate electrode 124 is to be formed.

Still referring to FIG. 2A, a first protection layer 110 is formed over the AlGaN semiconductor layer 108, and the first protection layer 110 conformally extends along the sidewalls and the upper surface of the doped compound semiconductor block 109. Next, a second protection layer 112 is formed over the first protection layer 110. The first protection layer 110 and the second protection layer 112 are formed to conform to the sidewalls and the upper surface of the doped compound semiconductor block 109, so that the first protection layer 110 and the second protection layer 112 each have a horizontal portion directly over the doped compound semiconductor block 109. In some embodiments, the material of the second protection layer 112 may be different than the material of the first protection layer 110.

Referring to FIG. 2B, a source electrode 114 and a drain electrode 116 are formed over the AlGaN semiconductor layer 108. The source electrode 114 and the drain electrode 116 penetrate through the second protection layer 112 and the first protection layer 110 to contact the AlGaN semiconductor layer 108.

Next, a planarization process such as CMP is performed on the second protection layer 112. As shown in FIG. 2C, after the planarization process, the horizontal portion of the second protection layer 112 directly over the doped compound semiconductor block 109 is removed. The horizontal portion of the first protection layer 110 directly over the doped compound semiconductor block 109 is exposed from the second protection layer 112. The upper surface of the horizontal portion of the first protection layer 110 is coplanar with the upper surface of the second protection layer 112.

Referring to FIG. 2D, a third patterned mask layer 170 is formed over the second protection layer 112 and the exposed horizontal portion of the first protection layer 110. The third patterned mask layer 170 has a third opening 172, a fourth opening 174, and a fifth opening 176. The third opening 172 corresponds to the exposed horizontal portion of the first protection layer 110. The fourth opening 174 and the fifth opening 176 expose some regions of the upper surface of the second protection layer 112 where the extension portions 130 and 132 of the gate field plate 126 (shown in FIG. 2G)

are predetermined to be formed. In some embodiments, the material and formation method of the third patterned mask layer 170 may be the same as or similar to those of the first patterned mask layer 150.

Next, an etching process is performed on the first protection layer 110 through the third opening 172 of the third patterned mask layer 170. In detail, in this embodiment, the etching process may use an etchant which has a higher etching rate to the first protection layer 110 than to the second protection layer 112. Since the second protection layer 112 has higher etching selectivity than the first protection layer 110, the etchant hardly etches the portions of the second protection layer 112 that are exposed from the fourth opening 174 and the fifth opening 176 of the third patterned mask layer 170.

As shown in FIG. 2E, after the etching process, a first recess 118 is formed in the first protection layer 110, and the first recess 118 exposes the upper surface of the doped compound semiconductor block 109. Since the third opening 172 of the third patterned mask layer 170 corresponds to the horizontal portion of the first protection layer 110, the first recess 118 only penetrates through the first protection layer 110 but not penetrate through the second protection layer 112.

Next, an etching process is performed on the second protection layer 112 and the first protection layer 110 through the fourth opening 174 and the fifth opening 176 of the third patterned mask layer 170. Since the doped compound semiconductor block 109 has higher etching selectivity than the second protection layer 112 and the first protection layer 110, the etchant of the etching process hardly etches the portion of the doped compound semiconductor block 109 exposed from the third opening 172 of the third patterned mask layer 170. Furthermore, in this embodiment, the etching process may include a main-etching step for the second protection layer 112 and an over-etching step for the first protection layer 110.

As shown in FIG. 2F, after the etching process, a second recess 120 and a third recess 122 are formed in the second protection layer 112 and the first protection layer 110. The second recess 120 and the third recess 122 penetrate through the second protection layer 112 and extend into the first protection layer 110. The second recess 120 and the third recess 122 do not entirely penetrate through the first protection layer 110, and portions of the first protection layer 110 directly under the second recess 120 and the third recess 122 remain on the AlGaN semiconductor layer 108.

Next, the third patterned mask layer 170 over the first protection layer 110 and the second protection layer 112 is removed.

Referring to FIG. 2G, a gate electrode 124 and a gate field plate 126 connecting the gate electrode 124 are formed over the first protection layer 110 and the second protection layer 112. The gate electrode 124 is filled into the first recess 118 and contacts the doped compound semiconductor block 109. The gate field plate 126 has a connection portion 128 connecting the gate electrode 124, and a first extension portion 130 and a second extension portion 132 respectively filled into the second recess 120 and the third recess 122. The connection portion 128 is located over regions of the upper surfaces of the first protection layer 110 and the second protection layer 112 between the gate electrode 124 and the drain electrode 116.

Referring to FIG. 2H, an ILD layer 134 is formed over the first protection layer 110 and the second protection layer 112. The ILD layer 134 covers the gate electrode 124, the gate field plate 126, the source electrode 114, and the drain electrode 116. Next, a source contact 136 connecting the source electrode 114, a drain contact 138 connecting the drain electrode 116, and a gate contact 140 connecting the gate electrode 124 are formed in the ILD layer 134. After an interconnect structure including the ILD layer 134, the source contact 136, the drain contact 138, and the gate contact 140 are formed, a semiconductor device 200 is produced.

In the embodiments shown in FIG. 2H, the semiconductor device 200 includes the substrate 102 and the buffer layer 104, the GaN semiconductor layer 106, the AlGaN semiconductor layer 108 and the doped compound semiconductor block 109 sequentially stacked over the substrate 102. The semiconductor layer 200 also includes the first protection layer 110 which is disposed over the AlGaN semiconductor layer 108 and surrounds the sidewalls of the doped compound semiconductor block 109, and the second protection layer 112 which is disposed over the first protection layer 110. The second protection layer 112 is not disposed directly above the doped compound semiconductor block 109. The semiconductor device 200 also includes the source electrode 114 and the drain electrode 116 which penetrate through the second protection layer 112 and the first protection layer 110 and contact the AlGaN semiconductor layer 108.

The semiconductor device 200 also includes the gate electrode 124 penetrating through the first protection layer 110 and contacting the doped compound semiconductor block 109, and the gate field plate 126 connecting the gate electrode 124. The gate field plate has a connection portion 128 connecting the gate electrode 124, and the first extension portion 130 and the second extension portion 132 extending into the first second protection layer 112 and the first protection layer 110. The connection portion 128 is located over the second protection layer 112 and extends from the gate electrode 124 toward the drain electrode 116. The first extension portion 130 and the second extension portion 132 are located between the gate electrode 124 and the drain electrode 116. The first extension portion 130 and the second extension portion 132 are separated from the upper surface of the AlGaN semiconductor layer 108 by the first protection layer 110.

In the embodiments shown in FIGS. 2A-2H, since the first recess 118, the second recess 120 and the third recess 122 for forming the gate electrode 124 and the gate field plate 126 are formed by using the same patterned mask layer 170, one patterning process of forming recesses can be omitted, which can improve the fabricating efficiency of the semiconductor device.

In summary, the embodiments of the present disclosure utilize the gate field plate which has an extension portion extending into the protection layer to mitigate the electric field gradient at the side of the gate electrode that is proximate to the drain electrode to enhance the breakdown voltage of the semiconductor device, which in turn enhances the performance of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a compound semiconductor layer disposed over a substrate;
   a protection layer disposed over the compound semiconductor layer;
   a source electrode, a drain electrode and a gate electrode which penetrate through the protection layer and are disposed on the compound semiconductor layer, wherein the gate electrode comprises an upper portion above the protection layer; and
   a gate field plate laterally connecting to the upper portion of the gate electrode and disposed over a portion of the protection layer between the gate electrode and the drain electrode, wherein a top surface of the gate field plate and a top surface of the upper portion of the gate electrode are coplanar, wherein the gate field plate has an extension portion extending into the protection layer, and wherein the extension portion and a lower portion of the gate electrode are laterally spaced apart from each other by the protection layer.

2. The semiconductor device as claimed in claim 1, wherein the extension portion of the gate field plate is separated from the compound semiconductor layer.

3. The semiconductor device as claimed in claim 1, wherein the protection layer comprises:
   a first protection layer disposed over the compound semiconductor layer; and
   a second protection layer disposed over the first protection layer, wherein a material of the first protection layer is different from a material of the second protection layer.

4. The semiconductor device as claimed in claim 3, wherein the extension portion of the gate field plate penetrates through the second protection layer and extends into the first protection layer.

5. The semiconductor device as claimed in claim 1, further comprising:
   a doped compound semiconductor block disposed between the compound semiconductor layer and the gate electrode.

6. The semiconductor device as claimed in claim 5, wherein the protection layer comprises:
   a first protection layer surrounding sidewalls of the doped compound semiconductor block; and
   a second protection layer disposed over the first protection layer, wherein the second protection layer is not disposed directly above the doped compound semiconductor block, and wherein a material of the first protection layer is different from a material of the second protection layer.

7. The semiconductor device as claimed in claim 6, wherein the first protection layer has a horizontal portion over the doped compound semiconductor block, and an upper surface of the horizontal portion of the first protection layer is coplanar with an upper surface of the second protection layer.

8. The semiconductor device as claimed in claim 1, wherein the semiconductor device is a high electron mobility transistor (HEMT).

9. The semiconductor device as claimed in claim 1, wherein the gate field plate has another extension portion which is disposed between the extension portion and the drain electrode and extends into the protection layer.

10. A method for fabricating a semiconductor device, comprising:
    forming a compound semiconductor layer over a substrate;
    forming a protection layer over the compound semiconductor layer;
    forming a source electrode, a drain electrode, and a gate electrode through the protection layer and over the compound semiconductor layer, wherein the gate electrode comprises an upper portion above the protection layer; and
    forming a gate field plate over a portion of the protection layer between the gate electrode and the drain electrode to laterally connect to the upper portion of the gate electrode, wherein a top surface of the gate field plate and a top surface of the upper portion of the gate electrode are coplanar, wherein the gate field plate has an extension portion extending into the protection layer, and wherein the extension portion and a lower portion of the gate electrode are laterally spaced apart from each other by the protection layer.

11. The method as claimed in claim 10, wherein forming the gate electrode and the gate field plate comprises:
    forming a first recess and a second recess in the protection layer, wherein the second recess is between the first recess and the drain electrode;
    forming a conductive material layer to fill the first recess and the second recess; and
    patterning the conductive material layer to form the gate electrode filling the first recess and the gate field plate connecting the gate electrode and filling the second recess.

12. The method as claimed in claim 11, wherein the first recess exposes the compound semiconductor layer while the second recess does not expose the compound semiconductor layer.

13. The method as claimed in claim 12, wherein forming the protection layer comprises:
    depositing a first protection layer over the compound semiconductor layer; and
    depositing a second protection layer over the first protection layer, wherein a material of the first protection layer is different from a material of the second protection layer.

14. The method as claimed in claim 11, wherein forming the first recess and the second recess comprises:
    forming a first patterned mask layer over the protection layer;
    etching the protection layer through a first opening of the first patterned mask layer to form the first recess which exposes the compound semiconductor layer;
    removing the first patterned mask layer;
    forming a second patterned mask layer over the protection layer;
    etching the protection layer through a second opening of the second patterned mask layer to form the second recess which does not expose the compound semiconductor layer; and
    removing the second patterned mask layer.

15. The method as claimed in claim 11, further comprising:
    forming a doped compound semiconductor block after the compound semiconductor layer is formed and before the protection layer is formed, wherein the gate electrode is formed over the doped compound semiconductor block.

16. The method as claimed in claim 15, wherein forming the protection layer comprises:
depositing a first protection layer over the compound semiconductor layer to conformally cover sidewalls and an upper surface of the doped compound semiconductor block; and
depositing a second protection layer over the first protection layer, wherein a material of the first protection layer is different from a material of the second protection layer.

17. The method as claimed in claim 16, further comprising:
after the second protection layer is formed, performing a planarization process to remove a portion of the second protection layer directly above the doped compound semiconductor block so that a horizontal portion of the first protection layer directly above the doped compound semiconductor block is exposed.

18. The method as claimed in claim 17, wherein forming the first recess and the second recess comprises:
forming a third patterned mask layer over the first protection layer and the second protection layer after the planarization process;
etching the horizontal portion of the first protection layer through a third opening of the third patterned mask layer to form the first recess which exposes the compound semiconductor layer;
etching the first protection layer and the second protection layer through a fourth opening of the third patterned mask layer to form the second recess in the first protection layer and the second protection layer, wherein the second recess does not expose the doped compound semiconductor block; and
removing the third patterned mask layer.

19. The method as claimed in claim 11, wherein forming the first recess and the second recess further comprises forming a third recess between the second recess and the drain electrode,
wherein the conductive material layer further fills the third recess,
wherein the gate field plate has another extension portion filling the third recess after the conductive material layer is patterned.

* * * * *